(12) United States Patent
Masleid

(10) Patent No.: US 6,701,444 B2
(45) Date of Patent: Mar. 2, 2004

(54) METHOD AND APPARATUS FOR PROCESS INDEPENDENT CLOCK SIGNAL DISTRIBUTION

(75) Inventor: Robert Paul Masleid, Monte Sereno, CA (US)

(73) Assignee: International Business Machines Corporation, Armonk, NY (US)

(*) Notice: Subject to any disclaimer, the term of this patent is extended or adjusted under 35 U.S.C. 154(b) by 110 days.

(21) Appl. No.: 10/116,813

(22) Filed: Apr. 5, 2002

(65) Prior Publication Data

US 2002/0113633 A1 Aug. 22, 2002

Related U.S. Application Data

(62) Division of application No. 09/422,367, filed on Oct. 21, 1999, now Pat. No. 6,552,589.

(51) Int. Cl.[7] .................................................. G06F 1/10
(52) U.S. Cl. ..................... 713/401; 713/400; 713/401; 713/500; 713/501; 713/502; 713/503; 713/600; 716/4; 716/5; 716/6
(58) Field of Search .............................. 713/400–600; 716/4–6

(56) References Cited

U.S. PATENT DOCUMENTS

| | | | | |
|---|---|---|---|---|
| 4,337,433 A | * | 6/1982 | Yoshimura | 327/270 |
| 4,975,598 A | * | 12/1990 | Borkar | 326/32 |
| 5,180,937 A | * | 1/1993 | Laird et al. | 327/276 |
| 5,477,178 A | * | 12/1995 | Maki | 327/161 |
| 5,656,963 A | | 8/1997 | Masleid et al. | 327/297 |
| 5,712,883 A | | 1/1998 | Miller et al. | 375/371 |
| 5,842,001 A | * | 11/1998 | Kubota | 713/400 |
| 5,944,836 A | * | 8/1999 | Edahiro | 713/503 |
| 6,232,806 B1 | * | 5/2001 | Woeste et al. | 327/149 |

OTHER PUBLICATIONS

Maskazu Shoji; Elimination of Process–Dependent Clock Skew in CMOS VLSI; Journal of Solid–State Circuits, vol. SC–21, No. 5, Oct. 1986, pp. 875–880.

* cited by examiner

Primary Examiner—Dennis M. Butler
Assistant Examiner—Nitin C Patel
(74) Attorney, Agent, or Firm—Duke W. Yee; Thomas E. Tyson

(57) ABSTRACT

A method and apparatus for restoring tracking in a circuit in which gate and metal capacitance vary independently. The present invention allows Shoji balancing to be extended to the situation where the gate and metal capacitance in a circuit vary independently across a process window. This is accomplished by regarding the inverting stage in a clock distribution system as a buildup mirror and applying the tracking principles of proportional composition. Loads are reflected through this mirror and resized by the buildup factor to extend Shoji balancing from just one process parameter setting to the entire process window.

12 Claims, 4 Drawing Sheets

METHOD AND APPARATUS FOR PROCESS INDEPENDENT CLOCK SIGNAL DISTRIBUTION

This application is a divisional of application Ser. No. 09/422,367, filed Oct. 21, 1999, now U.S. Pat. No. 6,552,589.

BACKGROUND OF THE INVENTION

1. Technical Field

The present invention relates to a method of clock distribution in an integrated circuit, and more particularly, to a method of clock distribution that is independent of process variations.

2. Description of Related Art

In a digital system, a clock signal is distributed to each module for controlling the timing of data transfer operations between the modules in the system. For example, a computer may include several modules mounted in a chassis and interconnected by backplane wiring to a module containing a central controller and a clock signal source. One of the conductors in the backplane carries the clock signal to each of the other modules in the system. For proper operation of the system, clock signal pulses should arrive at the various modules at substantially the same time. Otherwise, the data transmissions may not be reliable. Because the modules are at varying distances along the backplane from the clock signal source, the clock signal pulses do not arrive at each module concurrently. The difference in time between the arrival of the signals at each module is referred to as clock signal skew. Such clock signal skew is tolerable at lower clock signal frequencies where the skew is small compared to the period of the clock signal. However, at higher clock frequencies the clock signal skew becomes a significant portion of the clock signal period, and thus data transmission on the backplane becomes unreliable unless compensation is made for the skew.

Clock signal skew is also an important consideration in the design of the integrated circuits contained within each of the modules in a computer system. An internal clock signal is distributed to the circuits in a chip through some form of distribution network. Clock skew within a chip is the variability in the time that the internal clock signal reaches various parts of the circuit. Clock distribution networks within an integrated circuit are comprised of amplifier chains and distribution wiring. From a phase locked loop-like clock source to final circuit clock load, a clock distribution network must develop a gain of approximately 100,000 for current processor chips which have a number of latches on the order of $10^5$ to $10^6$. For minimum clock latency (delay through the clock distribution), optimal gain per simple inverter stage is approximately 3. Thus, approximately 10 inverter stages with an approximate gain of 3 are required to develop this gain. For example, if the gain of each inverter stage is set at 3.2 with 10 stages, then the total gain is 112,590 ($3.2^{10}$=112,590).

Masleid et al. (U.S. Pat. No. 5,656,963), hereby incorporated by reference, disclose:

A clock distribution network for distributing a clock signal across a VLSI chip. A H-tree is combined with an x-y grid to allow buffering of the clock signal, while minimizing clock skew across the chip. The H-tree distributes a plurality of repower buffer levels above a final repower buffering level. The output of the final level are coupled by the x-y grid to minimize clock skew caused by the chip and by local loading variations in the circuits.

Clock distribution is a high priority in the allocation of chip physical resources. Clock uncertainty, which is the total error in clock arrival time due to all effects, generally consumes approximately 10% of the machine cycle time. Therefore, it is usually worthwhile to spend roughly 5% to 15% of the transistor, metal, and chip power resources to deal with the clock uncertainty. Since the clock source is physically very small, most of the resources are spent on the clock distribution.

In the prior art, several clock distribution problems have solutions only if special routes on certain planes at constrained locations are used. See, for example, the system described by Masleid et al. (U.S. Pat. No. 5,656,963). The distribution routing and location cannot generally be changed after chip placement and routing have occurred. Therefore, these routes and locations must be determined and conveyed to the project early in the design as part of the chip image definition.

Very little schedule time can be allocated to waiting on final clock tuning. Aggregate design and technology improvements advance microprocessor performance at approximately 100% every 18 months or 1% per week. A fine tuning method that shaves 1% off the uncertainty of clock distribution but delays production a week to accomplish the fine tuning makes no real gain.

Shoji balancing allows "process beta shift" to be eliminated from the clock path tracking problem. Process beta shift is a manufacturing tolerance in which the relative strength of a PFET to a NFET, both of fixed sizes, varies during the manufacture of a chip. Shoji balancing techniques are used to design an integrated circuit such that the delay through the circuit depends to the same degree on the strength of the NFETs and the strength of the PFETs in the circuit. However, Shoji balancing does not account for the effects of gate capacitance and metal capacitance on clock path tracking.

Therefore, a method of reducing the uncertainty in a clock distribution is needed that either may be implemented early in the design stage or that is independent of chip placement and routing. The method should account for variations in process parameters across the process window such that the clock distribution is independent of such variations.

SUMMARY OF THE INVENTION

The present invention allows Shoji balancing to be extended to account for gate and metal capacitance variation in a circuit. This is accomplished by regarding an inverting stage in a clock distribution system as a buildup mirror and applying the tracking principles of proportional composition. Loads are reflected through this mirror and resized by the build-up factor to extend Shoji balancing from just one process parameter variation to the entire process window.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
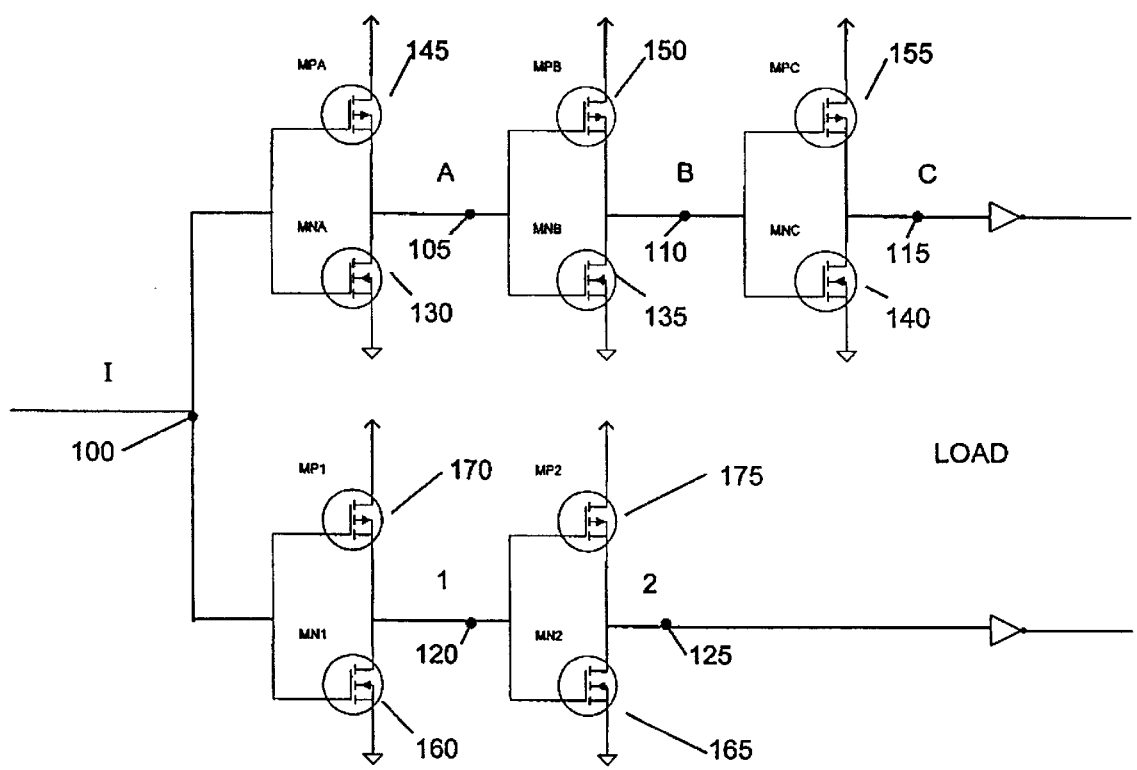
FIG. 1 is a schematic of CMOS inverter chains used to generate a pair of inverting and non-inverting clocks that is helpful for understanding the prior art Shoji balancing concept.

Front End of Line (FEOL) and Back End of Line (BEOL) are terms used to refer to the initial and final stages of semiconductor fabrication, respectively. During FEOL fabrication, n-well, transistor, diffusion, and gate fabrication are accomplished usually at high temperature with dopants and glasses. During the BEOL stage, the contact and metal portion of the semiconductor fabrication is accomplished at low temperatures and usually with organic insulators and chemical-etch planarization. BEOL process parameters vary independently of each other and independently of FEOL process parameters. In particular, the various metal and dielectric thicknesses have nothing to do with each other. Inter-Layer Dielectric (ILD) variation (capacitance) across a typical process is approximately +/−10% and metal thickness variation is approximately +/−15%. However, faster parts will tend to have lower wiring capacitance and therefore thicker ILDs and wider spaces.

As a result, clock distribution schemes that are tuned assuming a fixed set of process parameters become de-tuned as the process wanders away from that fixed set of parameters. The following examples illustrate this problem:

(1) Example: A 100 ohm M3 (Metal 3=the third wiring plane) wire supplies a 0.1 pF clock load. An 'identical' 100 ohm M4 (Metal 4=the fourth wiring plane) wire supplies another 0.1 pF load. Even though the loads are identical, the two RCs can mistrack each other by +/−30% due to variations in wire thickness alone over the process window. The full variation is unlikely, but must be accounted for in fast path analysis. The variation can, of course, be calculated and reported, but it cannot be removed.

(2) Example: A hypothetical 200 ohm, 0.0 pF M4 wire supplies a 0.05 pF clock load. A hypothetical 50 ohm, 0.0 pF M4 wire supplies a 0.2 pF clock load. These RCs track when the process parameters vary, assuming the simple implied model, RwCg, Cw=0. Unfortunately, once wire capacitance (Cw) is included, the RCs do not track.

The stability of absolute delay through the various branches of a clock distribution is desirable but cannot be practically achieved. Process and ambient conditions make that impossible. Fortunately, a good clock distribution is obtained if branch delays match under a given process/ambient condition (e.g., fast process (i.e., the variation of the semiconductor parameters that produce a relatively fast part, high Tj, where Tj refers to junction temperature) and track each other as conditions change. For example, consider two branches with nominally matched delays of 1.0 ns. If gate capacitance for some reason doubles, and both delays grow to 1.5 ns, then the two branch delays track with respect to that process variation.

This method of compensating for clock skew during circuit design is called "matched delays." Under a given set of process conditions, matched delays allow the latency of the clock distribution to be removed from consideration during logical circuit design. Matched delays that remain matched over the process window in spite of variations in the process parameters are here referred to as "tracking delays." Tracking delays are even more advantageous in clock distributions than other matched delays. Tracking delays allow a given clock edge to propagate through different paths and yet arrive at the end of those paths at the same time under any permutation of process parameter variations. Even if the paths are routes that lead to different locations, the use of tracking delays allows the clock to be distributed to those different locations with zero skew.

One method for designing for tracking delays is here referred to as "Shoji balancing." See "Elimination of Process-Dependent Clock Skew in CMOS VLSI," M. Shoji, IEEE JSSC October 1986, hereby incorporated by reference. Shoji balancing is the method of tuning paths so all their delays depend on PFET and NFET strength to the same degree.

Figure 2A:
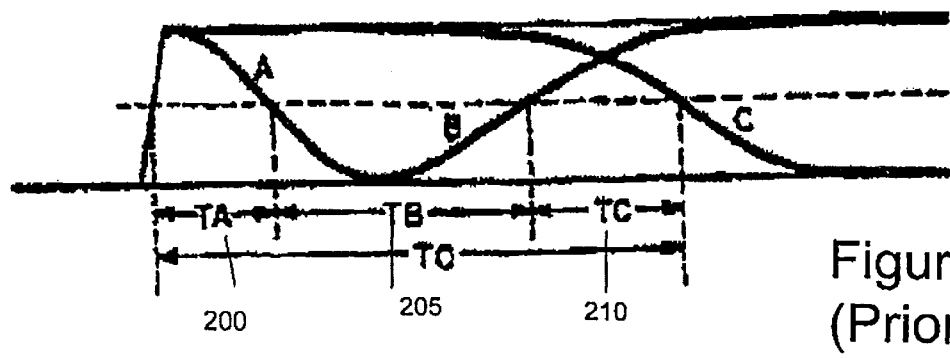
FIGS. 2A and 2B are graphical illustrations of the waveforms produced at the intermediate nodes A, B, C, 1, and 2 for the prior art circuit of FIG. 1.
Figure 2B:
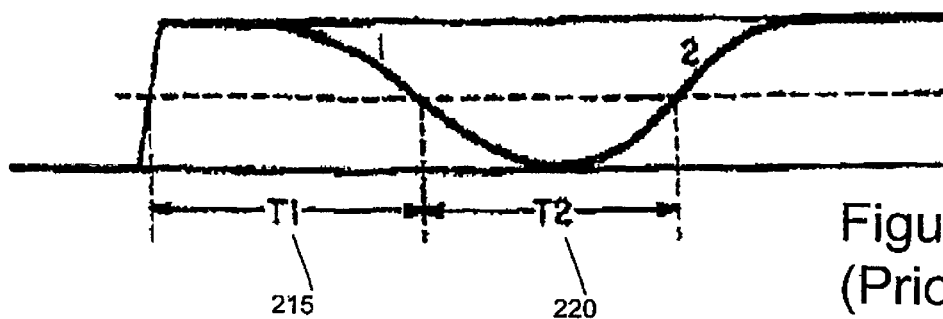

Referring now to FIG. 1, a schematic of CMOS inverter chains used to generate a pair of inverting and non-inverting clocks is helpful for understanding Shoji balancing. When the input node I 100 makes a low-to-high transition, the waveforms at the intermediate nodes A 105, B 110, C 115, 1 120, and 2 125 are as shown schematically in FIGS. 2A and 2B. In order to make the clocks skew-free, a conventional designer designs the circuit by scaling the FET's to satisfy $$T_I = T_{NI} = T_O \quad (1)$$

where $$T_I = T_A + T_B + T_C \quad (2)$$

$$T_{NI} = T_1 + T_2 \quad (3)$$

This design is carried out assuming typical process conditions. When the same circuit is processed by the high-current process, delays $T_A$ 200, $T_B$ 205, $T_C$ 210, $T_1$ 215, $T_2$ 220 will be different. Delay $T_A$ 200 depends on the drive capability of an NFET 130 (MNA of FIG. 1) which changes by a factor $f_N$, where $f_N > 1$, in the high-current process. Then $$T_A(H) = T_A(1/f_N) \quad (4)$$

and $$T_A(H) < T_A \quad (5)$$

Shoji demonstrated that if the circuit is originally designed to satisfy $$T_B = T_2 \quad (6)$$

in addition to the condition of zero skew at the typical process (equation (1)), then the circuit remains skew-free, whatever the process may be. From equations (1) and (6) we obtain $$T_A + T_C = T_1. \quad (7)$$

Equations (6) and (7) represent the following: when input node I 100 of FIG. 1 pulls up, gates A 105, C 115, and 1 120 pull down, by NFET MNA 130, MNC 140, and MN1 160, respectively. Equation (7) means that the sum of the pull-down delays by NFET MNA 130 (gate A 105) and MNC 140 (gate C 115) of the first logic chain should be equal to the pull-down delay of NFET MN1 160 (gate 1 120) of the second logic chain. Further, gate B 110 of the first chain and gate 2 125 of the second chain pull up. Equation (6) means that the pull-up delays of PFET MPB 150 (gate B 110) and that of MP2 175 (gate 2 125) should be equal.

By equations (6) and (7) the delays contributed by NFET and PFET are separately matched. If the precision matching is exercised, the delays of the two chains are robustly matched whatever the process variation is between PFET and NFET strength. If only total delays of the two chains are matched (by equation (1)), the delay will not be matched if the process varies. This design procedure is always possible. Because delays are determined by the size of FET's in FIG. 1 (MPA, MNA, . . . , MN2), many design solutions are possible.

"Process beta" refers to the relative strength of a PFET to an NFET, both of fixed sizes. Ideally, process beta is constant, but in reality the process beta varies within a manufacturing tolerance referred to as "process beta shift." The Shoji balancing described above allows process beta shift to be eliminated from the clock path tracking problem. Unfortunately, Shoji balancing does not account for gate capacitance and metal capacitance. In other words, Shoji balancing matches dependence on PFET/NFET strengths, but does not account for load variations. Therefore, gate capacitance load on one stage that is gate-load dominated mistracks metal load on the next stage one inversion away that is metal-load dominated even if Shoji balancing is performed at one setting of the process parameters.

For a given transition, the variation of metal capacitance may affect an NFET-based delay while the variation of gate capacitance affects a PFET-based delay. This spoils the Shoji balancing when viewed across the entire process window.

Substantial variation in process beta ratio exists between technology generations and perhaps even more variation occurs within a technology over the process window. Beta variation perturbs the duty cycle of clocks as they pass through inverter amplifier chains.

Using the method of the present invention, most beta variation effects on clock duty cycle and edge matching of differential clocks can be nulled out if clock distribution chains are proportioned such that:

(clock rise latency dependence on P)=
(clock rise latency dependence on N)=
(clock fall latency dependence on P)=
(clock fall latency dependence on N).

This may be accomplished by applying Shoji balancing and by using distribution chains having the same physical proportions. Using distribution chains with the same physical proportions is here referred to as "proportional composition." The chains are constructed such that any physical parameter in one chain is represented in the same proportion in another chain. Such a construction results in a change in a parameter caused by process variation, for example, having the same effect in each chain. For example, a 10 micron PFET/5 micron NFET complimentary inverter driving a 50 micron M2 wire has the same delay as a 20 micron PFET/10 micron NFET complimentary inverter driving a 100 micron M2 wire. In other words, two circuits have tracking delays if the structural composition of each circuit is such that all process physical parameters are represented in both circuits in the same ratios and the two circuits have identical delay at some process condition.

Figure 3A:
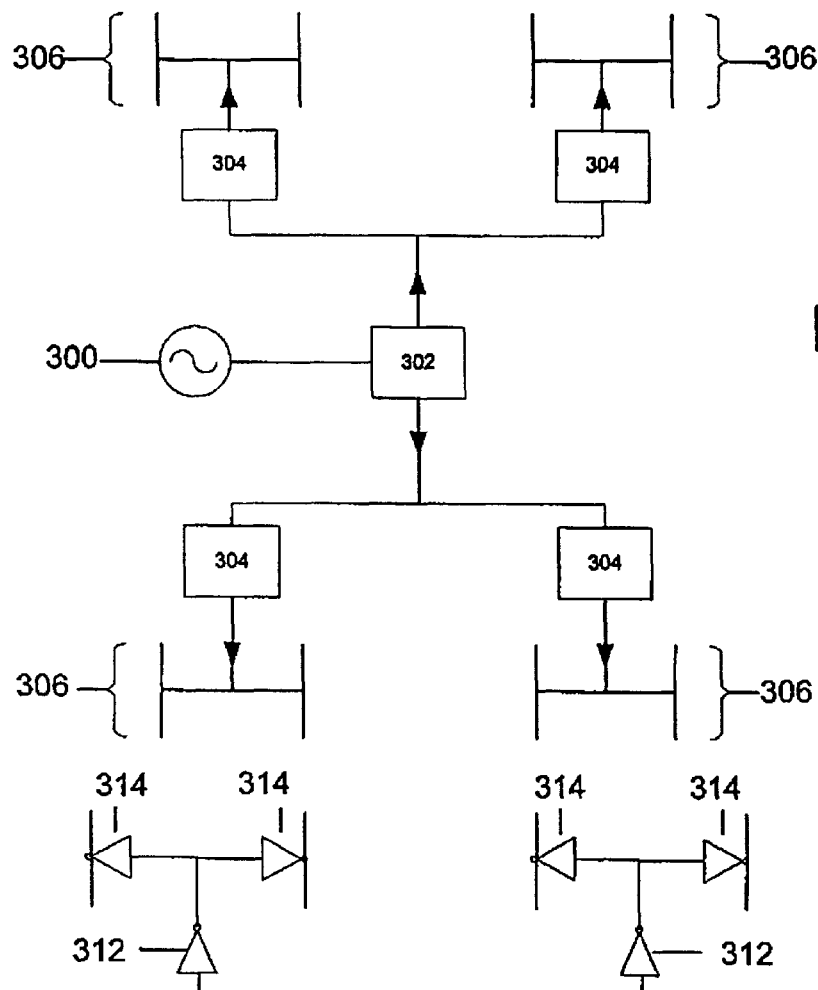
FIGS. 3A and 3B are schematics of two different forms of clock distribution systems in which the method of the present invention may be implemented.
Figure 3B:
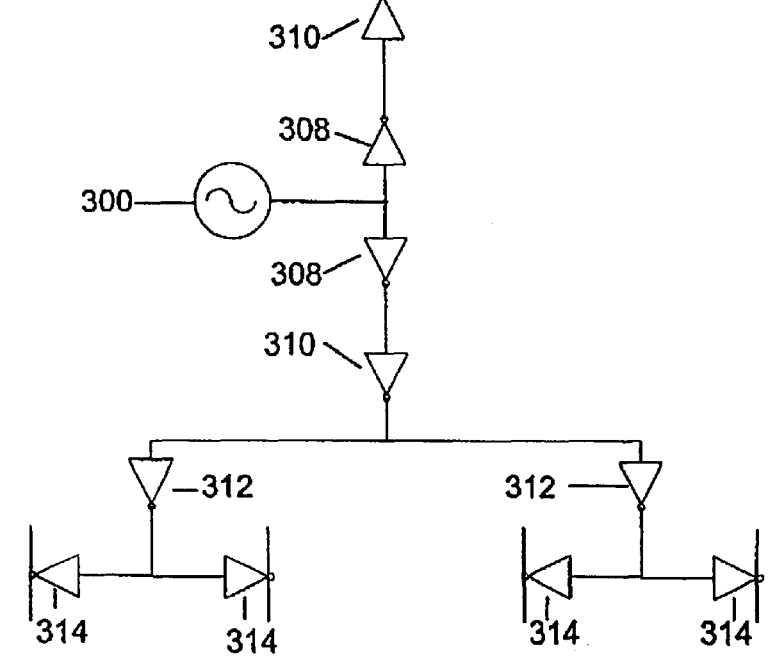

Referring now to FIGS. 3A and 3B, two schematics show two different forms of clock distribution systems in which the method of the present invention may be implemented. However, the methods of the present invention are not limited to these particular forms of clock distribution. In FIG. 3A, a clock source 300 is input into a repower buffer 302 which then splits the clock signal four ways and amplifies the signal for input to a second level of repower buffers 304. The repower buffers 304 each drive a conventional H-tree 306 in the clock distribution system. Each H-tree 306 distributes the clock signal to various parts of the chip. The system in FIG. 3B is similar except that clock repeaters 308, 310, 312, 314 are used instead of clock buffers as in FIG. 3A. The clock repeaters perform the same function as the clock buffers in repowering the clock signal.

Figure 4A:
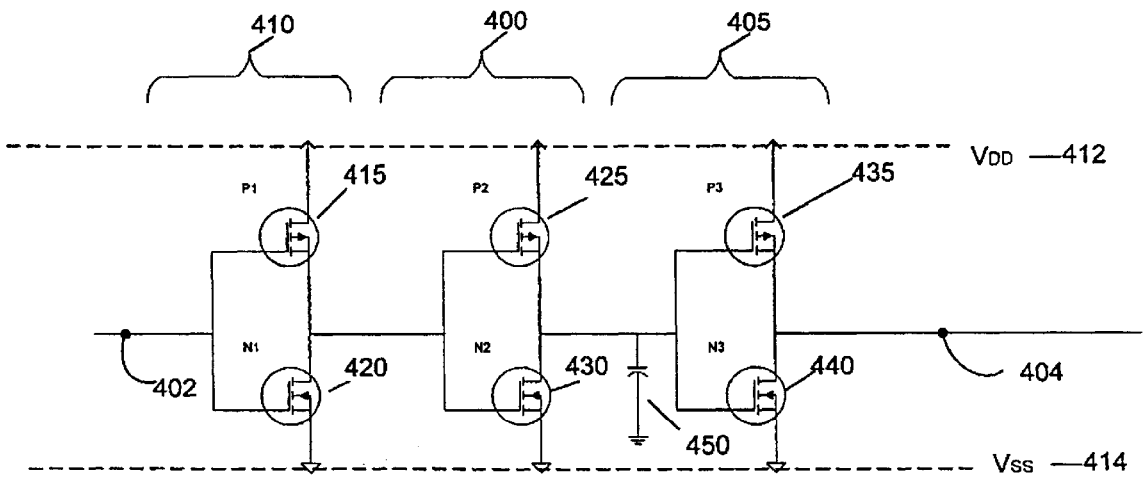
FIGS. 4A and 4B are schematics of inverter chains in a clock distribution circuit illustrating how the method of a preferred embodiment is implemented.
Figure 4B:
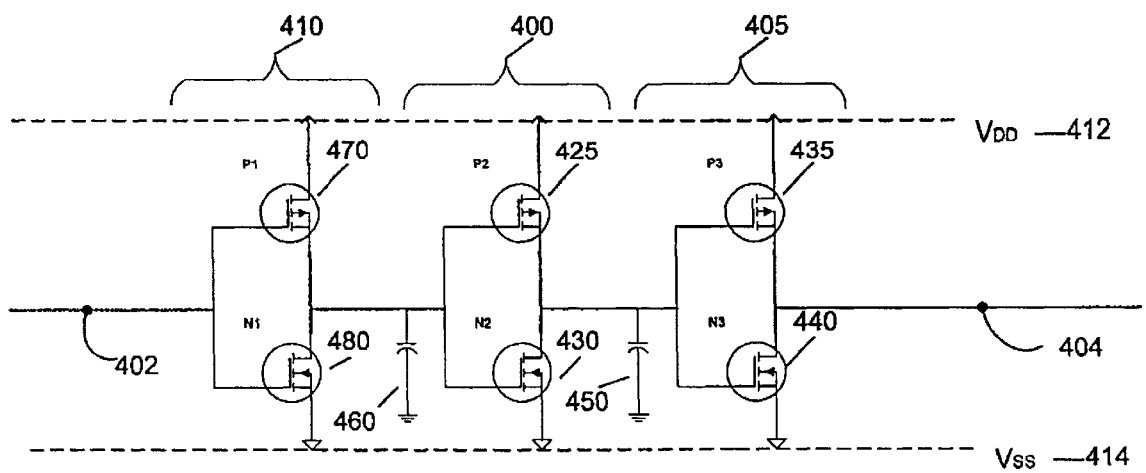

Referring now to FIGS. 4A and 4B, a portion of a clock distribution circuit schematic is shown. The circuit of FIGS. 4A and 4B could be, for example, a clock buffer driving an H-tree distribution system as shown in FIG. 3A or a clock repeater in the chain as shown in FIG. 3B.

An intermediate inverter stage 400 drives a subsequent inverter stage 405, with each stage repowering the clock signal. The intermediate inverter stage 400 is driven by a driving stage 410. Each stage is made up of complementary p-type and n-type field effect transistors. The p-type transistors are all connected to a reference voltage $V_{DD}$ 412 and the n-type transistors are connected to a lower reference voltage $V_{SS}$ 414. In the present invention, the ratio of the size of the NFET to the size of the PFET in each stage is designed such that the ratio in all of the stages is the same. This ratio is applied to the other chains of the distribution system as well. The Shoji balancing technique described earlier is used to set this ratio. For example, if the sizes of the PFET 415 and the NFET 420 in the driving stage 410 is 20 microns and 10 microns, respectively, then the ratio is 2:1 and this should also be the ratio for the intermediate inverter stage 400 and the subsequent inverter stage 405. The size of FETs of the intermediate stage 400 and the subsequent stage 405 would thus depend on the 2:1 ratio as well as the gain required. The driving stage 410 of FIG. 4A has 100% gate load (the intermediate stage 400 input), as no wire capacitance is shown on the input to the intermediate stage 400. Although strictly speaking a wire always has a capacitance, it is not shown on the driving stage in this example because it is negligible compared to the gate load of the driving stage and would cloud the principles being illustrated. In other words, the load of the driving stage is gate-load dominated.

For purposes of illustration, assume that Shoji balancing techniques are used to give a ratio of 2:1 for the size of the PFET and NFET in each stage. Further assume that a "buildup" of 3 is desired for the intermediate stage 400 to give optimal gain in the stage. Buildup refers to the ratio of the size of the FETs in one stage to the size of the FETs in the previous stage. Thus, if the driving stage has an NFET 420 with a size of 10 microns, then the 2:1 ratio requires that the PFET 415 be 20 microns in size. Furthermore, a buildup of 3 requires the PFET 425 and the NFET 430 sizes in the intermediate stage 400 be 60 microns and 30 microns, respectively. Assuming that the buildup desired for the subsequent inverter stage 405 is 1.5, the PFET 435 and the NFET 440 must be 90 microns and 45 microns, respectively. Using this technique gives Shoji balancing to the circuit.

However, this balancing technique does not account for variations in the capacitive wire load 450. Assuming that the capacitive wire load is the same as the gate capacitance of a 135 micron FET, the intermediate stage 400 drives a 50% wire load in addition to the 50% gate load (90 microns+45 microns=135 microns). (The capacitive load of the two transistors (one a 90 micron and the other a 45 micron) is added together because by nature FETs exhibit a capacitive load in this configuration even when they are off.) Hence a tracking Shoji balance does not exist because the NFET load for a given edge propagating through the circuit does not have the same composition as the PFET load. This is corrected in FIG. 4B by copying the wire capacitance 450 of the intermediate stage 400 load, shrinking it by 1.5 (the buildup of the intermediate stage), and adding a capacitive wire load of this size 460 to the load of the driving stage 410. Thus, using the parameters given above, a wire load 450 equivalent to a 90 micron FET (135/1.5=90) is added to the load of the driving stage 410.

Because the load on the driving stage 410 is increased by a factor of 2 from 90 to 180 (90+60+30=180), the delay created by the driving stage 410 changes. To restore the original delay, the size of PFET 415 and NFET 420 must also be increased by a factor of two to 40 microns and 20 microns, respectively. The circuit as modified in FIG. 4B, has a load on the driving stage which is composed of a 50% gate load from the PFET 425 and the NFET 430 and a 50% capacitive wire load. This is a composition which is identical to the load on the intermediate stage 400. The buildup for the intermediate stage is changed from 3 to 1.5 because of the increase in size of the FETs in the driving stage, but the gain remains the same for each stage. Thus, the NFETs and PFETs all encounter the same load composition regardless of which path a clock edge takes through the circuit and Shoji balancing is preserved across the process window.

In a clock distribution system with numerous amplifier chains, this process is accomplished for each stage. In a preferred embodiment, the designer should begin inserting these buildup mirror loads at the final stage of an amplifier chain, working backwards to the initial stage in order to avoid inserting large wire capacitances. However, the designer could also begin at the initial stage and work forward to the end of the amplifier chain. The designer may also skip several stages of amplifiers to make the inserted mirror load very small compared to the load it is compensating. In this manner, the mirror load is reduced by the total buildup of the stages between the insertion point and the load that the mirror is compensating. Further, the designer can arrange the number and locations of inversions in the path so that existing wiring can serve as some or all of the compensating mirror load. In this way, the wire capacitance which is inserted is as small as possible. Although the invention has been described in terms of copying wire loads, the same technique could be used to copy gate loads instead. Consider FIG. 4B but assume it is out of balance due to unmatched composition. As already described, wire load can be added to the stage where wire load is under-represented. Equally well, gate load can be added to the stage where gate load is under-represented.

In general, delay structures will commonly mix independent process variables, yet it is still possible to design for tracking. The techniques of the present invention are applicable to any circuit regardless of the composition of the circuit. That is, although the invention has been described in terms of a simple inverter, the "inverting stage" can be any type of logical gate which inverts the input, including but not limited to a NAND or a NOR gate as the inverting stage. To maximize tracking among such delay structures, the same proportions of independent process variables should be maintained in each structure whenever such variables are summed in the delay equation.

Although the present invention has been described in terms of implementation on a VLSI chip, the method of the present invention may be applied on any scale. For example, it may be applied to the design of a computer system with various modules to which a clock signal is distributed.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles and the practical application of the invention and to enable others of ordinary skill in the art to understand the invention for various embodiments with various modifications as are suited to the particular use contemplated.

What is claimed is:

1. A method for constructing a clock distribution with tracking delays comprising the steps:

(a) determining a first load of an inverting stage in the clock distribution; and (b) inserting a second load into an input of the inverting stage wherein the second load has a value which is a scaled value of the first load.

2. The method of claim 1 wherein the first load that comprises a gate load.

3. The method of claim 2 wherein the first load comprises a plurality of components of the gate load.

4. The method of claim 1 further comprising the step:

(c) resizing a driving stage of the inverting stage such that an original delay is maintained.

5. The method of claim 4 further comprising the step:

(d) applying a proportional composition tracking principle.

6. The method of claim 1 wherein the second load is smaller than the first load by a buildup factor for the inverting stage.

7. A method for designing a clock distribution with tracking delays comprising the steps:

(a) determining a first load of a driving stage driving an inverting stage in the clock distribution; and (b) inserting a second load into a load of the inverting stage, wherein the second load has a value which is a scaled value of the first load.

8. The method of claim 7 wherein the first load comprises a gate load.

9. The method of claim 8 wherein the first load comprises a plurality of components of the gate load.

10. The method of claim 7 further comprising the step:

(c) resizing the inverting stage such that an original delay is maintained.

11. The method of claim 10 further comprising the step:

(d) applying a proportional composition tracking principle.

12. The method of claim 7 wherein the second load is smaller than the first load by a buildup factor for the inverting stage.

* * * * *

UNITED STATES PATENT AND TRADEMARK OFFICE
CERTIFICATE OF CORRECTION

PATENT NO. : 6,701,444 B2
APPLICATION NO. : 10/116813
DATED : March 2, 2004
INVENTOR(S) : Masleid It is certified that error appears in the above-identified patent and that said Letters Patent is hereby corrected as shown below:

Col. 8, line 22: after "load" delete "that".

Signed and Sealed this

Twenty-sixth Day of June, 2007

JON W. DUDAS
*Director of the United States Patent and Trademark Office*